June 4, 1957 T. W. COOPER 2,794,942
JUNCTION TYPE SEMICONDUCTOR DEVICES
AND METHOD OF MAKING THE SAME
Filed Dec. 1, 1955

THEODORE W. COOPER,
INVENTOR
BY Henry Heyman
ATTORNEY

United States Patent Office 2,794,942

Patented June 4, 1957

2,794,942

JUNCTION TYPE SEMICONDUCTOR DEVICES AND METHOD OF MAKING THE SAME

Theodore W. Cooper, Torrance, Calif., assignor to Hughes Aircraft Company, Culver City, Calif., a corporation of Delaware Application December 1, 1955, Serial No. 550,316

9 Claims. (Cl. 317—235)

Figures 1, 2:
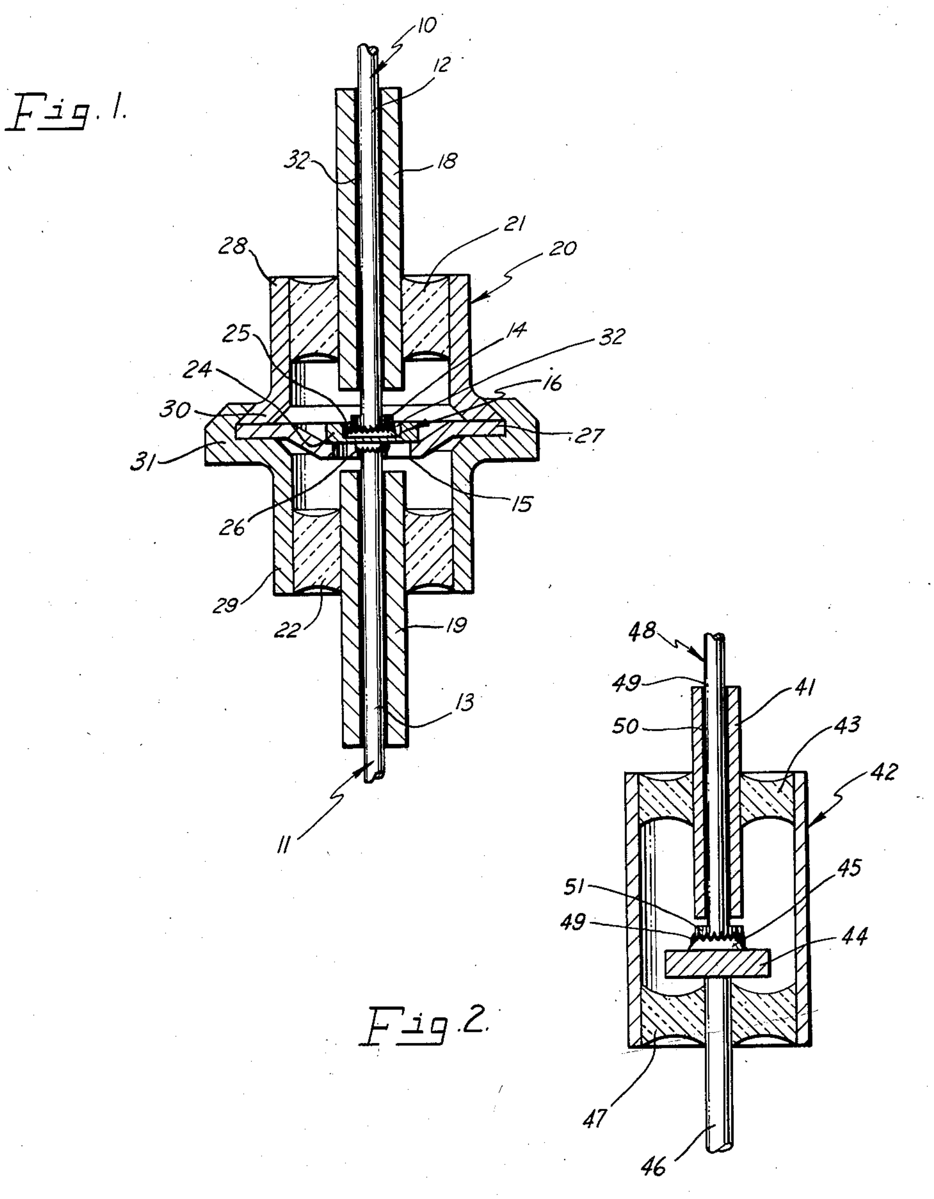

This invention relates to semiconductor signal translating devices and, more particularly, to an improved method for forming an ohmic contact with an area of junction-type semiconductor crystal in an encapsulated semiconductor device and to such devices.

Semiconductor materials, such as germanium, silicon, germanium-silicon alloys, indium-antimonide, gallium-antimonide, aluminum-antimonide, indium-arsenide, gallium-arsenide, gallium-phosphorus alloys, and indium-phosphorus alloys, and others, have been found to be extremely useful in electrical translating devices.

Basic to the theory of operation of semiconductor devices is the concept that current may be carried in two distinctly different manners, namely "conduction by electrons" or "excess electron conduction" and "conduction by holes" or "deficit electron conduction." The fact that electrical conductivity by both of these processes may occur simultaneously and separately in a semiconductor specimen affords a basis for explaining the electrical behavior of semiconductor devices. One manner in which the conductivity of a semiconductor specimen may be established is by the addition of "active impurities" into the base semiconductor material.

In the semiconductor art, the term "active impurity" is used to denote those impurities which affect the electrical characteristics of a semiconductor material as distinguished from other impurities which have no appreciable effect upon these characteristics. Generally, active impurities are added intentionally to the semiconductor material for producing single crystals for bodies having predetermined electrical characteristics. Active impurities are classified as either donors—such as antimony, arsenic, bismuth, and phosphorus—or acceptors, such as indium, gallium, thallium, boron and aluminum. A region of semiconductor material containing an excess of donor impurities and yielding an excess of free electrons is considered to be an impurity doped N-type region. An impurity doped P-type region is one containing an excess of acceptor impurities resulting in a deficit of electrons, or stated differently, an excess of holes.

Semiconductor diodes or transistors utilizing semiconductor crystals of any of the above enumerated materials can be produced with stable electrical characteristics even when a small volume of air is allowed to remain in a package or envelope hermetically sealing the crystal. Point contact semiconductor devices of the type now well known to the art may include a semiconductor crystal and one or more whisker elements in point contact therewith. Among the principal disadvantages of a point contact semiconductor device are the inefficient heat dissipation rate of the device and the relatively low current carrying capacities of the device, both of which are in part caused by the small area of contact between the whisker element and the crystal. It is necessary that point contact devices be operated at relatively low current so as not to exceed their low power dissipation.

When a continuous solid specimen such as a crystal or body of semiconductor material has an N-type region adjacent a P-type region, the boundary between the two regions is termed a P-N or N-P junction. The desirability and advantages of junction, or broad-area, semiconductor devices are apparent and by now well known to those skilled in the art. Among the advantages of semiconductor fused junction devices for some applications are included improvements in such characteristics as lower noise, higher power efficiency, lower operating voltage, greater power handling ability, and similar improvements. Through recent advances in the production of P-N junctions, junction type semiconductor devices have become increasingly important in the art.

A significant problem in the production of junction type semiconductor diodes and transistors has been the formation of a good ohmic connection between the semiconductor crystal body and the contact electrode which extends from the crystal body through the package of an encapsulated device. For example, in the production of a fused junction transistor of the type now well known to the art, the transistor comprises a semiconductor crystal body to which at least three separate ohmic connections are made. Where three connections are used, two are respectively on opposite sides of the semiconductor body, and a third is made to a portion of the body intermediate these sides. More specifically, in an N-P-N junction transistor or a P-N-P junction transistor, of the type in which the fused function is formed by the fusion of a pellet of solvent metal containing an active impurity of the type which determines the conductivity type of the regrown crystal region to the surface of the semiconductor crystal, the two connections are made at substantially opposite points of opposed faces of the parent crystal and a third ohmic connection is made at an edge between these faces. Thus, for example, in an N-P-N junction transistor, in which lead-arsenic pellets are fused to opposed surfaces of a P-type germanium crystal to form opposed N-type regions, a first connection is made at one of the N-type regrown crystal regions by ohmically connecting a contact electrode to the lead-arsenic pellet, a second connection is similarly made at the opposed N-type regrown crystal region, and the third connection is made at the surface of the P-type region which separates the two N-type regrown regions. If a relatively low voltage is applied between one opposed connection and the third connection so that a relatively low impedance is encountered, and a relatively high voltage is applied between the other opposed connection and the third connection so that a relatively high impedance is encountered, the current introduced into a low impedance is extracted from a high impedance and amplification results. The connection at which the current is introduced is known in the art as the "emitter" and the connection at which the current is extracted is known in the art as the "collector." The third connection is known as the "base" or "base electrode."

In the state of the art prior to the present invention, the ohmic connection between the contact electrodes and the collector and emitter regions of the semiconductor crystal body have commonly been formed by utilizing conductors in the form of a ribbon, spring, or whisker which is affixed between the surface of the emitter and collector regions and the electrodes. Such methods of forming the ohmic connection, however, limit the amount of contact which can be obtained between the conductor and the crystal region, resulting in a high thermal resistance at the point of contact between the conductor and the semiconductor crystal surface. Further, in production, difficulties are encountered when the device is assembled because of the various geometrical configurations of the crystal and electrode assemblies.

In addition to the above-described difficulties encountered in forming an efficient ohmic connection with a region of the semiconductor crystal in an encapsulated semiconductor device, the presence of oxides on the surface of the crystal or the surface of the material used to form the junction region introduces further difficulties. In order to form an efficient ohmic connection, it is necessary to pierce or otherwise overcome the presence of the oxide layer.

Accordingly, it is an object of the present invention to provide an improved ohmic connection to an area of a semiconductor crystal body.

It is another object of the present invention to provide an improved means for forming an ohmic connection between a contact electrode and an area of a semiconductor crystal body which is hermetically encapsulated.

It is a further object of the present invention to provide an improved means for forming an ohmic connection having a large area of contact between a contact electrode and an area of an encapsulated semiconductor crystal body.

It is still a further object of the present invention to provide an improved ohmic connection to an area of a semiconductor crystal body which obviates difficulties caused by the presence of oxides or foreign matter present in the surface of the crystal body to which ohmic contact is to be made.

It is still another object of the present invention to provide a means for, and method of, forming an ohmic connection to a hermetically encapsulated semiconductor device while retaining the hermetic seal within the encapsulating envelope and which lends itself to ease and uniformity of production.

The present invention comprises, in combination with an encapsulated semiconductor device, an ohmic connection to an area of the semiconductor crystal body, the ohmic connection comprising a contact electrode within the encapsulating envelope of the semiconductor crystal device, the contact electrode having a serrated surface in contact with the area of the semiconductor crystal body at which ohmic contact is to be made.

The novel features which are believed to be characteristic of the invention, both as to its organization and method of operation, together with further objects and advantages thereof, will be better understood from the following description considered in connection with the accompanying drawing, in which two embodiments of the invention are illustrated by way of example. It is to be expressly understood, however, that the drawing is for the purpose of illustration and description only, and is not intended as a definition of the limits of the invention.

Fig. 1 is a sectional view of an illustrative junction-type transistor device to which the ohmic connections are made in accordance with the present invention; and Fig. 2 is a cross-sectional view of an illustrative junction-type diode in which the ohmic connection is made in accordance with the present invention.

Referring now to the drawing, Fig. 1 shows a fused junction transistor of the type known to the art which is illustrative of the semiconductor devices in which the method of the present invention may be advantageously utilized. Fig. 2 similarly shows a fused junction diode of the type well known to the art in which the method of the present invention has been utilized to obtain the ohmic connection between the contact electrode and the fused junction region of the semiconductor crystal body. For purposes of illustration, an N-P-N junction transistor of the type disclosed and claimed in copending application Serial No. 496,554 for "Semiconductor Transistor Device," by Warren P. Waters and Richard A. Gudmundsen, filed March 24, 1955, and assigned to the assignee of the present application, in which germanium is utilized as the semiconductor body will be described to show the utility and operation of the present invention. It will be recognized, however, that the method and the operational steps of assembly to be described may be employed to form ohmic connections to P-N-P or N-P-N junction transistors or junction diodes in which germanium, silicon, or intermetallic semiconductors are used as the semiconductor body.

Referring now to Fig. 1, the present invention is an ohmic connecting means in combination with an encapsulated semiconductor device of the type known to the prior art. In accordance with the present invention, a first contact electrode 10 and a second contact electrode 11 are positioned in ohmic contact with first and second lead-arsenic pellets which define the opposed N-type regions of an N-P-N semiconductor transistor body to which ohmic connections are to be made. The first and second contact electrodes each comprise a first electrode 12 and a second electrode 13 with a first contact plate 14 and a second contact plate 15, respectively, affixed to the ends thereof. In this embodiment the contact plate 14, 15 has a serrated planar contact surface. The serration causes the surface to have a plurality of pyramidal points and corresponding depressions. When the contact plate of the contact electrode is brought into contact with the area of the semiconductor transistor body 16 to which the ohmic connection is to be made, the points pierce the oxide layer to form an efficient ohmic contact. In order to more clearly describe the present invention, the production of an N-P-N junction transistor will be described in some detail. Although the method of encapsulating the semiconductor crystal and the method of positioning the contact electrode within the encapsulating envelope do not form part of this invention, the present invention will be described in conjunction with an N-P-N fused junction transistor encapsulated as described by Waters and Gudmundsen, supra. The method of affixing and positioning the contact electrode as disclosed in copending United States application Serial No. 550,317 for "Junction-Type Semiconductor Devices and Method of Making the Same," by Theodore W. Cooper, filed December 1, 1955, assigned to the assignee of the present application, has also been found to give excellent results when used in combination with the contact electrode of the present invention. In accordance with Cooper, supra, tubular members 18, 19 extend from the encapsulating envelope 20 and are positioned with an open end of the respective tubular members proximate opposed lead-arsenic pellets which define the N-type regions of the N-P-N semiconductor transistor body 16 to which ohmic connections are to be made. Sintered glass beads 21, 22 are positioned between the tubular members 18, 19 and the inner wall of the encapsulating envelope 20 in such a manner that the tubular members are mechanically affixed to the encapsulating envelope but electrically insulated therefrom. The first electrode 12 and the second electrode 13 having an outside diameter substantially equal to, but less than, the inside diameter of the tubular members 18, 19 are positioned within the respective tubular members. The space between the electrodes and the respective tubular members is filled with a quantity of solder which mechanically affixes the electrodes and tubular members and furnishes a hermetic seal for the encapsulating means. The first and second contact plates 14, 15, as described hereinbefore, are affixed to the ends of the respective electrodes 12, 13. The points on the contact surface of each contact plate pierce the oxide layer of the lead-arsenic pellet to form an ohmic contact therewith. In order to obtain a larger area of contact and to mechanically affix the contact plate to the pellet or other material defining the region to which the ohmic connection is to be made, the depressions in the contact surface are filled with molten solder prior to the formation of the ohmic contact. Thus, for example, when a lead-arsenic pellet is used to form the N-type region, the points are depressed into the pellet and the solder which was positioned in the depressions of the contact surface forms a further large area ohmic contact and mechanical connection between the contact plate and the lead-arsenic pellet.

In the presently preferred embodiment of the invention as shown in Fig. 1, the transistor is a fused junction N-P-N transistor having a P-type germanium crystal body 24 with N-type fused junction regions on opposed surfaces thereof. In this illustrative transistor, the semiconductor transistor body is formed by fusing a lead-arsenic emitter pellet 26 to one surface of the P-type germanium wafer 24 which is of the order of ⅛" on a side and 12 mils in thickness. The emitter pellet 26 is approximately 20 mils in diameter and is fused to the surface of the germanium body 24 by methods well known to the art. The collector pellet 25, which is also a lead-arsenic pellet and is approximately 40 mils in diameter, is similarly fused to the opposed surface of the germanium body 24 to form the collector P-N junction. The P-type base region between the emitter and collector junctions is then approximately 1.5 mils in thickness. After fusion it will be noted that the collector junction has a larger area than the emitter junction which is generally desirable.

The semiconductor crystal body is hermetically encapsulated as disclosed in the copending application to Gudmundsen and Waters, supra, by affixing the semiconductor transistor body 16 to a diaphragm 27. The diaphragm 27 is a dish-shaped disc of electrically and thermally conductive material which defines an opening symmetrical about the centerline having a diameter substantially less than the width of the transistor body 16 but greater than the diameter of the larger P-N junction of the body. Gold paste, solder, or other thermally conductive material is used to affix the transistor body 16 to the diaphragm 27 such that the center lines of the emitter and collector junctions are substantially coincident with the longitudinal centerline of the diaphragm. The encapsulating package for the transistor comprises a first body portion 28 and a second body portion 29 which are hollow cylinders of thermally conductive material having open ends and an outwardly directed right angle flange 30, 31 at one end thereof. The flange 30 of the first body portion 28 is substantially equal in diameter to the outside diameter of the diaphragm 27. However, the flange 31 of the second body portion 29 is substantially greater in outside diameter than the flange of the first body portion by an amount sufficient to allow crimping of the second flange 31 over the diaphragm 27 and the first flange 30 as shown. The diaphragm 27 and the first and second body portions 28, 29 may be formed of cold rolled steel. It is to be understood, however, that the encapsulating means and the means for positioning and retaining a semiconductor crystal body may be any of the types now known to the art since they form no part of the present invention. The method of mounting the crystal body and the means for encapsulating the semiconductor crystal body described above have, however, given excellent results in combination with the present invention.

In the embodiment shown, the electrodes 12, 13 and contact plates 14, 15 are formed of Kovar and the contact plates are flanged surfaces at the inner end of the electrodes 12, 13, lying in a plane substantially perpendicular to the center line of the electrodes. The outside diameter of the first and second contact plates is of the order of 0.06", while the outside diameter of the first and second electrodes is substantially equal to, but less than, 0.03". The contact surface of the contact plates 14, 15 is serrated by forming a series of intersecting triangular grooves in the planar surface, thus forming a plurality of pyramidal points and corresponding depressions. Before assembly of the semiconductor device, the depressions in the contact surface are filled with solder.

Although the contact electrodes 10, 11 of the present invention may be mounted and positioned in the encapsulated device by methods known to the art, the method of mounting and positioning the electrodes disclosed in the copending application to Cooper, supra, has been found to be particularly advantageous. Accordingly, the production of such a device utilizing the contact electrodes of the present invention will be described as illustrative. The electrodes 12, 13 are inserted into the tubular members after being pre-tinned in order to furnish the necessary amount of solder to fill the volume between the outside surface of the electrode and the inside surface of the tubular member. The first tubular member 18 and the second tubular member 19 are positioned proximate the respective emitter and collector areas to which the ohmic connections are to be made by extending the tubular members 18, 19 through the encapsulation means while electrically insulating them therefrom. In this embodiment, the tubular members 18, 19 are formed of iron-nickel alloy and are of the order of 0.06" in outside diameter with an inside diameter of the order of 0.03". For production purposes, it has been found advantageous to affix and seal the tubular members within the body portions by using a sintered glass insulative bond in the form of the glass beads 21, 22 surrounding each tubular member which is formed under high pressure to effect the insulative seal. In the production of a transistor, the first and second tubular members 18, 19 are insulatively affixed and sealed within the first and second body portions 20, 21, respectively, with the first and second contact electrodes 10, 11 positioned in the respective tubular members. Since the contact plates 14, 15 form a shoulder at the end of the electrodes 12, 13, the electrodes 10, 11 may be accurately positioned by butting the shoulder against the end of the respective tubular member. The space between the inside surface of the tubular members and the outside surface of the contact electrodes is filled with solder. The first and second body portions 28, 29 of the envelope are then mated with the diaphragm 27 with the semiconductor crystal body 16 positioned between the flanges, and the device is assembled and sealed by crimping the flange 31 over the flange 30 and the diaphragm 27. The flanges are mated and joined in such a way that a hermetic seal is obtained between the respective body portions.

The assembly of the transistor device is then completed and an ohmic contact is obtained at the collector and emitter junctions, in accordance with the present invention, by heating the contact electrodes 10, 11 and tubular members 18, 19 to a temperature above the melting point of the solder. After the solder becomes molten, the contact electrodes are advanced to the position at which electrical contact is obtained between the contact electrodes and the emitter 26 and collector 25 pellets, respectively. Molten solder is thus present in the depressions of the contact surface and is advanced to the emitter and collector regions. Since the solder is molten it will be sufficiently displaced to allow the serrations at the contact surface to pierce the surface of the pellet. After ohmic connection has been determined electrically, the contact electrodes are further advanced a predetermined amount to cause the pyramidal points in the serrated contact surface to pierce any oxide layer which may be present on the surface of the pellets and to provide a relatively large area of contact between the contact surface and the molten solder, and the respective emitter and collector pellets. The distance through which the contact electrodes are advanced may be determined by routine experiment of one skilled in the art. Rather than a further advancement of the electrodes after ohmic contact is obtained, the contact electrodes may also be advanced by a predetermined spring pressure to obtain the required area of contact and the required amount of piercing of the pellet surface by the contact surface. Since molten solder 32 is also present within the tubular members in sufficient quantity to fill the space between the outside diameter of the electrodes 12, 13 and the inside diameter of the tubular members 18, 19, a hermetic seal is obtained as the contact electrodes are allowed to cool. In addition, the tubular member may be mechanically staked to the contact electrode to furnish additional mechanical strength and rigidity.

Referring now to Fig. 2, a fused junction diode of the type in which the method of the present invention may be advantageously utilized is shown.

As discussed hereinbefore, a tubular member 41, having a contact electrode 48 positioned therein, is affixed and sealed within the encapsulating envelope 42 of the diode in such a way that the tubular member extends from a position proximate the area of the semiconductor crystal to which ohmic contact is to be made through a wall of the envelope. The tubular member 41 is again electrically insulated from the encapsulating means, or envelope, by means of a sintered glass bead 43. In the diode shown for illustrative purposes, a P-type germanium crystal body 44 having an N-type regrown crystal region formed by the fusion of a lead-arsenic pellet 45 to a surface thereof is used. In the diode shown, an ohmic connection to the P-type crystal body by the electrode 46 is obtained by methods well known to the art during an early stage in the assembly of the device. For example, the electrode 46 is positioned and maintained within the envelope by means of a second sintered glass bead 47 and the germanium body 44 is affixed to the inner end of the electrode 46 by gold paste or similar ohmic connecting means. The contact electrode 48 in accordance with the present invention is positioned within the tubular member 41 while filling the space between the tubular member and the contact electrode with molten solder 49. The contact electrode 48 again comprises an electrode 50 and a contact plate 51 having a serrated planar contact surface with solder filling the depressions in the contact surface. The final seal of the device and the ohmic connection to the lead-arsenic pellet 45 is obtained by heating the contact plate and tubular member to a temperature above the melting point of the solder. The contact electrode 48 is then advanced to pierce any oxide layers which may be present on the surface of the lead-arsenic pellet, as described hereinbefore, and to form a relatively large ohmic contact area. The molten solder again completes the contact area and insures a good ohmic and mechanical connection. Upon cooling, a hermetic seal is obtained in the tubular member and a large area ohmic contact is obtained with the lead alloy pellet and thus with the N-type region of the P-type crystal.

Although a contact electrode having a flanged contact plate has been described in the presently preferred embodiments of the present invention, the contact electrode may assume other configurations, and in some cases wherein the electrode has a sufficiently large diameter to form the contact surface at the end thereof, the end of the contact electrode may be serrated to form the oxide piercing contact surface. Further, although a serrated surface has been described, other configurations may also be utilized to obtain a piercing surface.

Thus, the present invention provides a large area ohmic contact in an encapsulated semiconductor device and allows an ohmic and mechanical connection which is superior to those heretofore known to the art by piercing any layers of oxides or other foreign matter which may be present upon the surface to which the ohmic connection is to be made. The present invention lends itself readily to mass production techniques, while allowing uniformity of results with respect to the ohmic contact that is necessary in encapsulated semiconductor devices.

What is claimed is:

1. In an encapsulated junction type semiconductor device, an ohmic connecting means to an area of a semiconductor crystal body having a P–N junction therein, said ohmic connecting means comprising: a contact electrode having a contact surface, said contact surface providing a plurality of piercing means, and a quantity of solder at said contact surface.

2. In an encapsulated junction type semiconductor device, an ohmic connecting means to an area of a semiconductor crystal body having a P–N junction therein, said ohmic connecting means comprising: a contact electrode having a contact surface affixed thereto, said contact surface being serrated to define a plurality of piercing means, and a quantity of solder at said contact surface.

3. In an encapsulated junction type seimconductor device, an ohmic connecting means to an area of a semiconductor crystal body, said ohmic connecting means comprising: an electrode, a contact plate affixed at the end of said electrode proximate the area of said semiconductor crystal body to which the ohmic connection is to be made, said contact plate having a contact surface, said contact surface defining a plurality of piercing means and corresponding depressions, and a quantity of solder in said depressions.

4. In an encapsulated junction type semiconductor device, an ohmic connecting means to an area of a semiconductor crystal body, said ohmic connecting means comprising: an electrode, a contact plate affixed at the end of said electrode proximate the area of said semiconductor crystal body to which the ohmic connection is to be made, said contact plate having a contact surface, said contact surface being serrated to form a plurality of points and corresponding depressions, said contact plate being in ohmic contact with said area of said semiconductor body, said points piercing the surface of said area, and a quantity of solder in ohmic contact with said area and said depressions.

5. In an encapsulated junction type semiconductor device, an ohmic connecting means to an area of a semiconductor crystal body having a P-N junction therein, said ohmic connecting means comprising: a tubular member extending through and electrically insulated from the encapsulating means for said semiconductor device, said tubular member having an open end proximate said area to which ohmic contact is to be made; a contact electrode within said tubular member extending from said open end of said tubular member, said contact electrode being in ohmic contact with said area, said contact electrode having a contact surface, said contact surface providing a plurality of piercing means, a quantity of solder at said contact surface; and means surrounding said contact electrode within said tubular member for hermetically sealing the volume between said contact electrode and said tubular member.

6. In an encapsulated junction-type semiconductor device, an ohmic connecting means to an area of a semiconductor crystal body having a P-N junction therein, said ohmic connecting means comprising: a tubular member extending through and electrically insulated from the encapsulating means for said semiconductor device, said tubular member having an open end proximate said area to which ohmic contact is to be made; a contact electrode within said tubular member extending from said open end of said tubular member, said contact electrode being in ohmic contact with said area, said contact electrode having a contact surface affixed thereto, said contact surface being serrated to define a plurality of piercing means, a quantity of solder at said contact surface; and a quantity of solder surrounding said contact electrode within said tubular member, whereby said contact electrode is mechanically affixed to and hermetically sealed within said tubular member.

7. In an encapsulated junction-type semiconductor device, an ohmic connecting means to an area of a semiconductor crystal body having a P-N junction therein, said ohmic connecting means comprising: a tubular member extending through and electrically insulated from the encapsulating means for said semiconductor device, said tubular member having an open end proximate said area to which ohmic contact is to be made; a contact electrode within said tubular member extending from said open end of said tubular member, said contact electrode being in ohmic contact with said area, said contact electrode comprising an electrode, a contact plate affixed at the end of said electrode proximate said area of said semiconductor crystal body, said contact plate having a contact surface, said contact surface being serrated to form a plurality of points and corresponding depressions, a quantity of solder in said depressions in ohmic contact with said contact plate and said area; and a quantity of solder surrounding said electrode within said tubular member to mechanically affix and hermetically seal said contact electrode within said tubular member.

8. In an encapsulated P-N junction semiconductor device having a semiconductor crystal body of one conductivity type and a region of semiconductor material of the opposite conductivity type with an envelope hermetically encapsulating said crystal body, the combination comprising: means for forming an ohmic connection with said region of opposite conductivity type, said ohmic connecting means comprising a tubular member extending through and electrically insulated from said encapsulating envelope, said tubular member having an open end proximate a surface of said region of said opposite conductivity type, a glass bead surrounding said tubular member in contact with the inner wall of said envelope so that said tubular member is mechanically affixed within and electrically insulated from said envelope; a contact electrode within said tubular member having an end extending from said open end of said tubular member, said contact electrode being in ohmic contact with said region of opposite conductivity type, said contact electrode comprising an electrode, a contact plate affixed at the end of said electrode proximate said region of opposite conductivity type, said contact plate having a contact surface, said contact surface being serrated to form a plurality of points and corresponding depressions, a quantity of solder in said depressions in ohmic contact with said contact surface and said area of said semiconductor crystal body; and a quantity of solder surrounding said contact electrode within said tubular member to mechanically affix and hermetically seal said contact electrode within said tubular member.

9. In an encapsulated junction type transistor having a semiconductor crystal body of one conductivity type and emitter and collector regions of opposite conductivity type at opposed surfaces of said crystal body of one conductivity type, with an envelope hermetically encapsulating said crystal body, the combination comprising: means for forming ohmic connections with said emitter and collector regions, said ohmic connecting means comprising a first and second tubular member extending through and electrically insulated from said encapsulating envelope, said first and second tubular member having an open end proximate said emitter and collector regions, respectively; a first and second contact electrode within said tubular members, respectively, said contact electrodes being in ohmic contact with said emitter and collector regions, respectively, said contact electrodes each comprising an electrode, a contact plate affixed at the end of said electrode proximate said emitter and collector regions, respectively, said contact plate having a contact surface, said contact surface being serrated to form a plurality of points and corresponding depressions, a quantity of solder in said depressions; and a quantity of solder surrounding said contact electrodes within their associated tubular members to mechanically affix and hermetically seal said contact electrodes within said tubular members.

References Cited in the file of this patent

UNITED STATES PATENTS

| | | |
|---|---|---|
| 1,496,671 | Gernsback | June 3, 1924 |
| 1,652,927 | Buchanan | Dec. 13, 1927 |